United States Patent
He

(10) Patent No.: US 9,488,712 B2
(45) Date of Patent: Nov. 8, 2016

(54) METHOD AND APPARATUS FOR COMPENSATING FOR GRADIENT DELAY IN MAGNETIC RESONANCE SCANNING SEQUENCE

(71) Applicant: Chao Ming He, Shenzhen (CN)

(72) Inventor: Chao Ming He, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 512 days.

(21) Appl. No.: 14/134,207

(22) Filed: Dec. 19, 2013

(65) Prior Publication Data

US 2014/0167751 A1   Jun. 19, 2014

(30) Foreign Application Priority Data

Dec. 19, 2012 (CN) .......................... 2012 1 0552140

(51) Int. Cl.
*G01V 3/00* (2006.01)
*G01R 33/565* (2006.01)

(52) U.S. Cl.
CPC .............................. *G01R 33/56572* (2013.01)

(58) Field of Classification Search
CPC .......... G01R 33/56572; G01R 33/565; G01R 33/56
USPC ........................................................ 324/307
See application file for complete search history.

(56) References Cited

U.S. PATENT DOCUMENTS 7,123,011 B2 * 10/2006 Machielsen .......... G01R 33/385
324/318

FOREIGN PATENT DOCUMENTS

JP            04135539 A    *    5/1992

OTHER PUBLICATIONS

Peters et al., "Centering the Projection Reconstruction Trajectory; Reducing Gradient Delay Errors", Jul. 2003, Magn Reson Med., 50(1), 1-6.*

* cited by examiner

*Primary Examiner* — Susan Lee
(74) *Attorney, Agent, or Firm* — Schiff Hardin LLP

(57) ABSTRACT

In a method and MR scanning apparatus for compensating for gradient delay in the MR scanning sequence, a current gradient amplitude of the MR scanning sequence is determined. Based on the current gradient amplitude and a mapping between gradient delay and gradient amplitude, a current gradient delay corresponding to the current gradient amplitude is determined. The gradient delay in the MR scanning sequence is compensated according to the current gradient delay.

12 Claims, 4 Drawing Sheets

METHOD AND APPARATUS FOR COMPENSATING FOR GRADIENT DELAY IN MAGNETIC RESONANCE SCANNING SEQUENCE

BACKGROUND OF THE INVENTION

1. Field of the Invention

The present invention relates to the technical field of magnetic resonance imaging, in particular to a method and apparatus for compensating for gradient delay in a magnetic resonance scanning sequence.

2. Description of the Prior Art

During a magnetic resonance (MR) scan, an MR scanning apparatus applies a gradient field to the sample being scanned by generating an MR scanning sequence having a gradient waveform. In order to obtain accurate scanning results, the gradient field must be precisely controlled. However, owing to the intrinsic characteristics of the MR scanning apparatus, such as self-inductance from electrical cables or gradient components, gradient delays will arise during generation of the MR scanning sequence, i.e. there will be a time difference between the moment at which a gradient waveform in the MR scanning sequence is actually generated and the ideal moment at which the gradient waveform in the MR scanning sequence is designed to be generated. Thus, it is necessary to compensate for time delays in the MR scanning sequence, to obtain a satisfactory scanned image.

FIG. 1 shows an existing method for performing compensation in an MR scanning sequence. As FIG. 1 shows, the method includes the following steps.

In step 11, multiple gradient delays are measured for an MR scanning apparatus. Generally, gradient delay can be measured at two typical gradient amplitudes. For example, the gradient delay can be measured when the gradient amplitude is 5 milliteslas/meter (mT/m) and 8 mT/m.

In step 12, the average value of the multiple gradient delays is calculated.

In step 13, fixed gradient delay compensation is performed on each gradient axis, the gradient delay used during compensation being the average value calculated. An MR scanning apparatus includes gradient axes in three directions, and in this step, the same gradient delay is used to perform compensation on each gradient axis.

It can be seen that with the existing method, once the gradient delay of the MR scanning apparatus has been determined, the gradient delay will remain unchanged even if the gradient amplitude changes; the effect of gradient amplitude on gradient delay has not been taken into account, and as a result the above method is mainly suited to MR scanning procedures in which the gradient amplitude remains unchanged. However, the development of MR scanning technology has led to there often being a need to adjust the gradient amplitude of the MR scanning sequence, in order to obtain more precise scanning results. Furthermore, high-level sequences such as echo planar imaging (EPI) pulse sequences and ultra-short echo time sequences have exacting requirements in terms of accuracy of gradient delay. In these cases, if gradient delay compensation is performed by the existing method, loss of image quality or artifacts will result, affecting the accuracy of the MR scan.

SUMMARY OF THE INVENTION

The embodiments of the present invention provide a method and apparatus for compensating for gradient delay in an MR scanning sequence, which can ensure the accuracy of scanning results, improve the quality of scanned images, and mitigate the effect of artifacts on scanned images.

The embodiments of the present invention provide the following technical solution.

The method provided in the embodiments of the present invention for compensating for gradient delay in an MR scanning sequence includes:
  determining a current gradient amplitude of the MR scanning sequence;
  on the basis of the current gradient amplitude and a mapping between gradient delay and gradient amplitude, determining a current gradient delay corresponding to the current gradient amplitude;
  compensating for gradient delay in the MR scanning sequence according to the current gradient delay.

In an embodiment of the present invention, the method further includes acquiring the mapping between gradient delay and gradient amplitude.

In another embodiment of the present invention, the step of acquiring the mapping between gradient delay and gradient amplitude includes:
  inputting multiple test sequences to each gradient axis of an MR scanning apparatus, each of the multiple test sequences having a different gradient amplitude;
  measuring gradient delays corresponding to the multiple test sequences;
  acquiring the mapping between gradient delay and gradient amplitude, the mapping comprising the gradient amplitudes of the multiple test sequences and the measured gradient delays.

In a further embodiment of the present invention, the step of determining a current gradient delay corresponding to the current gradient amplitude on the basis of the current gradient amplitude and the mapping between gradient delay and gradient amplitude includes:
  determining the gradient amplitude which is closest to the current gradient amplitude from amongst the gradient amplitudes included in the mapping between gradient delay and gradient amplitude;
  determining the gradient delay in the mapping between gradient delay and gradient amplitude which is closest to the determined gradient amplitude as the current gradient delay.

In another embodiment of the present invention, the step of acquiring the mapping between gradient delay and gradient amplitude includes:
  entering multiple test sequences for each gradient axis of an MR scanning apparatus, each of the multiple test sequences having a different gradient amplitude;
  measuring gradient delays corresponding to the multiple test sequences;
  on the basis of the gradient amplitudes of the multiple test sequences and the measured gradient delays, determining a fitting relationship between gradient delay and gradient amplitude as the mapping between gradient delay and gradient amplitude.

In another embodiment of the present invention, the step of determining a current gradient delay corresponding to the current gradient amplitude on the basis of the current gradient amplitude and the mapping between gradient delay and gradient amplitude includes:
  on the basis of the fitting relationship between gradient delay and gradient amplitude, determining a gradient delay corresponding to the current gradient amplitude as the current gradient delay.

The apparatus provided in the embodiments of the present invention for compensating for gradient delay in an MR scanning sequence includes:
- a storage module, for storing mappings between gradient delay and gradient amplitude corresponding to each gradient axis of an MR scanning apparatus;
- a gradient delay determining module, for determining a current gradient amplitude of the MR scanning sequence, and on the basis of the current gradient amplitude and the mapping between gradient delay and gradient amplitude, determining a current gradient delay corresponding to the current gradient amplitude;
- a gradient delay compensation module, for compensating for gradient delay in the MR scanning sequence according to the current gradient delay.

In an embodiment of the present invention, the apparatus further comprises: a mapping module, for acquiring the mapping between gradient delay and gradient amplitude.

In one embodiment of the present invention, the mapping module includes:
- a test sub-module, for inputting multiple test sequences to each gradient axis of the MR scanning apparatus, each of the multiple test sequences having a different gradient amplitude; and measuring gradient delays corresponding to the multiple test sequences;
- an acquisition sub-module, for acquiring the mapping between gradient delay and gradient amplitude, the mapping comprising the gradient amplitudes of the multiple test sequences and the measured gradient delays.

In another embodiment of the present invention, the gradient delay determining module is specifically used for determining the gradient amplitude which is closest to the current gradient amplitude from amongst the gradient amplitudes included in the mapping between gradient delay and gradient amplitude, and determining the gradient delay in the mapping between gradient delay and gradient amplitude which is closest to the determined gradient amplitude as the current gradient delay.

In another embodiment of the present invention, the mapping module includes:
- a test sub-module, for inputting multiple test sequences to each gradient axis of the MR scanning apparatus, each of the multiple test sequences having a different gradient amplitude; and measuring gradient delays corresponding to the multiple test sequences;
- a fitting sub-module, for determining a fitting relationship between gradient amplitude and gradient delay as the mapping between gradient delay and gradient amplitude, on the basis of the gradient amplitudes of the multiple test sequences and the measured gradient delays.

In a further embodiment of the present invention, the gradient delay determining module is specifically used for determining a gradient delay corresponding to the current gradient amplitude as the current gradient delay on the basis of the fitting relationship between gradient delay and gradient amplitude.

An MR imaging system provided in the embodiments of the present invention comprises any one of the above apparatuses for compensating for gradient delay in an MR scanning sequence.

It can be seen that in the embodiments of the present invention, compensation for gradient delay in an MR scanning sequence is performed on the basis of the gradient amplitude actually used, so that the MR scanning sequence is emitted at the correct time, ensuring the accuracy of scanning results. Furthermore, the accurate compensation of gradient delay results in the scanned image being of improved quality, with the effect of artifacts on the scanned image being mitigated or eliminated.

DESCRIPTION OF THE PREFERRED EMBODIMENTS

The embodiments of the present invention are illustrated in further detail below as examples, in order to explain the object, technical solution and advantages thereof.

Figure 1:
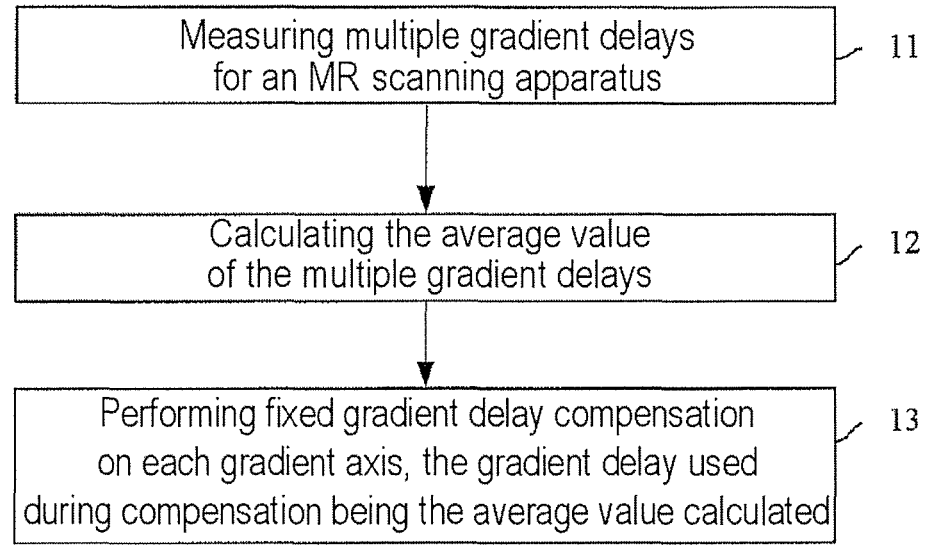
FIG. 1 is a flow chart of an existing method for performing compensation in an MR scanning sequence.
Figure 2:
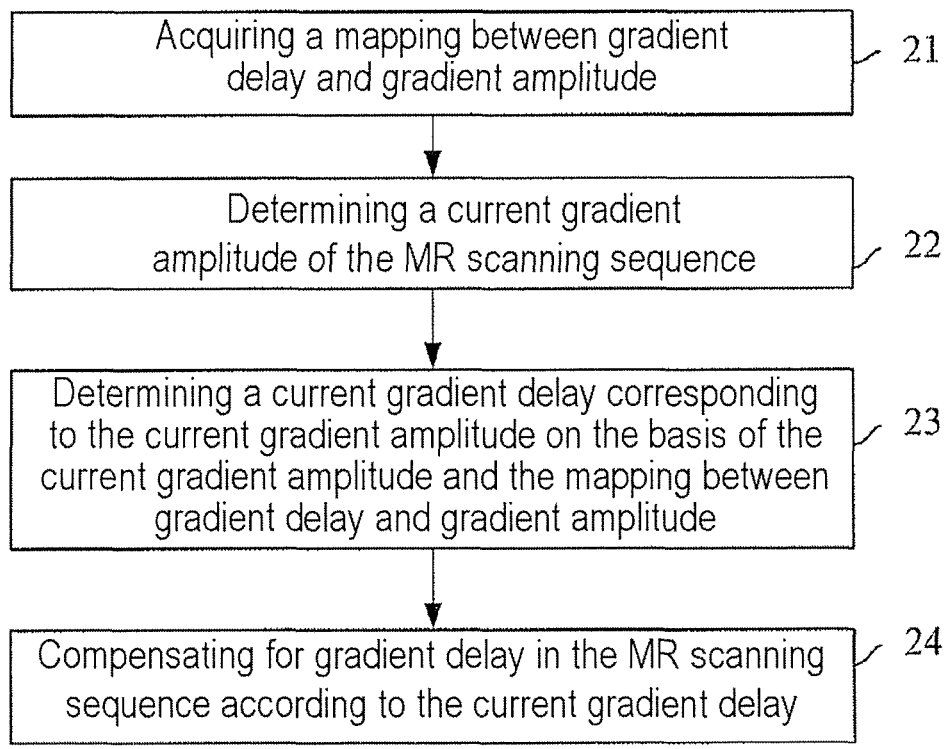
FIG. 2 is a flow chart of a method for performing compensation in an MR scanning sequence in the embodiments of the present invention.

FIG. 2 is a flow chart of the method for performing compensation in an MR scanning sequence in the embodiments of the present invention. As FIG. 2 shows, the method for performing compensation in an MR scanning sequence in the embodiments of the present invention comprises the following steps.

Step 21, acquiring a mapping between gradient delay and gradient amplitude.

After pre-assembly before leaving the factory and installation at the site of use, the mapping between gradient delay and gradient amplitude in a particular MR scanning apparatus is fixed. In this step, the mapping between gradient delay and gradient amplitude is acquired for each gradient axis of the MR scanning apparatus.

Since MR scanning sequences with different gradient amplitudes can be generated on the three different gradient axes of the MR scanning apparatus, MR scanning sequences with different gradient amplitudes can also be generated one after another on the same gradient axis. Therefore in the embodiments of the present invention, a mapping between gradient delay and gradient amplitude is acquired for each of the three gradient axes. Since the MR scanning sequence compensation operations performed on each gradient axis are similar, the following description uses the example of performing compensation on an MR scanning sequence generated on only one gradient axis for the purpose of illustration.

In the embodiments of the present invention, once the mapping between gradient delay and gradient amplitude has been determined, an appropriate gradient delay can be determined directly on the basis of the gradient amplitude of each MR scanning sequence before it is generated; there is no need to re-acquire the mapping between gradient delay and gradient amplitude each time. Correspondingly, this step need only be performed once after installation of the MR scanning apparatus has been completed.

Step 22, determining a current gradient amplitude of the MR scanning sequence.

During actual use, the user of an MR scanning apparatus can choose MR scanning sequences with different gradient amplitudes as required, in order to achieve better scanning results. Correspondingly, in this step, before the MR scanning apparatus generates an MR scanning sequence on each gradient axis, the current gradient amplitude of the MR scanning sequence is determined.

Step 23, determining a current gradient delay corresponding to the current gradient amplitude on the basis of the current gradient amplitude and the mapping between gradient delay and gradient amplitude.

Step 24, compensating for gradient delay in the MR scanning sequence according to the current gradient delay.

In this step, when the MR scanning apparatus generates an MR scanning sequence, compensation is performed in the MR scanning sequence according to the current gradient delay. For example, if the current gradient delay is 36 us, the MR scanning apparatus emits the MR scanning sequence after a delay of 36 us.

Figure 3A:
FIGS. 3a and 3b show MR scanned images.
Figure 3B:

Scanning results obtained after application of the embodiments of the present invention are illustrated below, by way of an example in which the MR scanning sequence is an EPI sequence. FIGS. 3a and 3b are a scanned image obtained using the embodiments of the present invention and a scanned image obtained using an existing method, respectively. The sample being scanned is a water phantom; when gradient delay compensation is not performed, N/2-ghost artifacts will appear in the scanned image due to delay caused by the intrinsic characteristics of the MR scanning apparatus, affecting the accuracy of the MR scan result.

In accordance with the compensation method provided in the embodiments of the present invention, the current gradient delay determined on the basis of the gradient amplitude of the EPI sequence and the mapping between gradient delay and gradient amplitude is 34 us. The corresponding scanning result is shown in FIG. 3a; specifically, signal strength is 616 while artifact strength is 19. In accordance with the compensation method provided in the prior art, in which the effect of gradient amplitude on gradient delay is not taken into account, the gradient delay finally obtained is 36 us. The corresponding scanning result is shown in FIG. 3b; specifically, signal strength is 607 while artifact strength is 125.

It can be clearly seen that when the embodiments of the present invention are applied, the accuracy of the scanning result is ensured because gradient delay compensation is performed on the basis of the gradient amplitude actually used. Specifically, it can be seen from the scanning result in FIG. 3b that when the existing compensation method is used, the EPI sequence has obvious N/2 ghost artifacts and the signal-to-noise ratio is relatively low, whereas in FIG. 3a, when the compensation method provided in the embodiments of the present invention is used, N/2 ghost artifacts have very little effect on the scanned sample, the signal-to-noise ratio is significantly higher, and so the user is provided with an MR scanned image of higher quality.

The embodiments of the present invention are explained in detail below according to different ways of acquiring the mapping between gradient delay and gradient amplitude.

Figure 4:
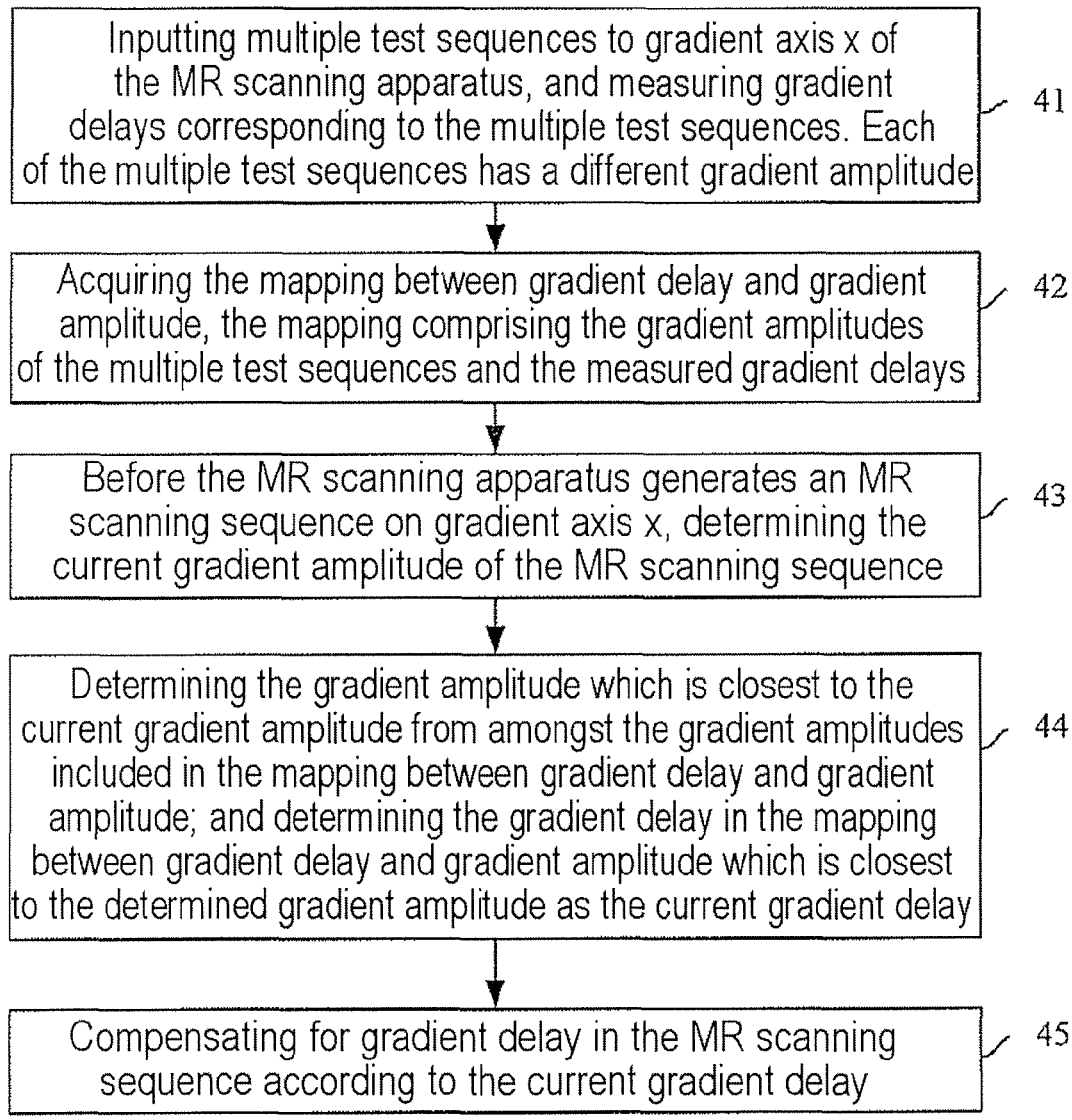
FIG. 4 is a flow chart of a method for performing compensation in an MR scanning sequence in another embodiment of the present invention.

FIG. 4 is a flow chart of a method for performing compensation in an MR scanning sequence in another embodiment of the present invention. As FIG. 4 shows, the method for performing compensation in an MR scanning sequence in the embodiments of the present invention comprises the following steps. In this embodiment, the example of one gradient axis (x) of the MR scanning apparatus is used for the purpose of illustration.

Step 41, inputting multiple test sequences to gradient axis x of the MR scanning apparatus, and measuring gradient delays corresponding to the multiple test sequences. Each of the multiple test sequences has a different gradient amplitude.

In the embodiments of the present invention, an existing method may be used to measure the gradient delays arising from the intrinsic characteristics of the MR scanning apparatus based on the inputted test sequences, such as the method disclosed in the Chinese patent with application number 201210006720.X, which will not be described superfluously here.

In this step, 20 test sequences are inputted to gradient axis x of the MR scanning apparatus, the gradient amplitude values of these 20 test sequences all being integers: 1, 2, . . . 20. Correspondingly, table 1 shows the measured gradient delays which correspond to the 20 test sequences.

TABLE 1

| | Gradient amplitude (mT/m) | | | | | | | | | |
|---|---|---|---|---|---|---|---|---|---|---|
| | 1 | 2 | 3 | 4 | 5 | 6 | 7 | 8 | 9 | 10 |
| Gradient delay (us) | 36.33 | 35.98 | 35.69 | 35.47 | 35.28 | 35.11 | 35.03 | 34.93 | 34.86 | 34.80 |
| | Gradient amplitude (mT/m) | | | | | | | | | |
| | 11 | 12 | 13 | 14 | 15 | 16 | 17 | 18 | 19 | 20 |
| Gradient delay (us) | 34.75 | 34.71 | 34.67 | 34.62 | 34.60 | 34.58 | 34.55 | 34.52 | 34.50 | 34.50 |

Step 42, acquiring the mapping between gradient delay and gradient amplitude, the mapping comprising the gradient amplitudes of the multiple test sequences and the measured gradient delays.

In this step, the mapping between gradient delay and gradient amplitude is acquired on the basis of the measurement results in table 1. Specifically, in this embodiment, the mapping may be expressed as: (1 mT/m, 36.33 us), (2 mT/m, 35.98 us) . . . (20 mT/m, 34.50 us).

Furthermore, steps 41 and 42 need only be performed once after installation of the MR scanning apparatus has been completed. The mapping between gradient delay and gradient amplitude determined can be used each time an MR scanning sequence is generated.

Step 43, before the MR scanning apparatus generates an MR scanning sequence on gradient axis x, determining the current gradient amplitude of the MR scanning sequence.

In this step, the current gradient amplitude of the MR scanning sequence is determined as 13.6 mT/m according to actual scanning requirements.

During actual use, the user can adjust several MR scanning sequence parameters, many of which will have an effect on the gradient amplitude of the MR scanning sequence. Once the user has fixed all adjustable parameters according to the actual scanning requirements, the MR scanning apparatus can determine the gradient amplitude of the MR scanning sequence, i.e. determine the current gradient amplitude of the MR scanning sequence.

Step 44, determining the gradient amplitude which is closest to the current gradient amplitude from amongst the gradient amplitudes included in the mapping between gradient delay and gradient amplitude; and determining the gradient delay in the mapping between gradient delay and gradient amplitude which is closest to the determined gradient amplitude as the current gradient delay.

Since the mapping between gradient delay and gradient amplitude does not include all possible gradient amplitude values, during actual use, the gradient amplitude value which is closest to the current gradient amplitude may be selected as an index to determine the corresponding gradient delay.

In this step, the closest whole value to the current gradient amplitude is found, the gradient amplitude corresponding to the current gradient amplitude being determined as 14 mT/m. According to the mapping between gradient amplitude and gradient delay determined in step 42, the current gradient delay is determined as 34.62 us.

Step 45, compensating for gradient delay in the MR scanning sequence according to the current gradient delay.

In this step, the MR scanning apparatus emits the MR scanning sequence after a delay of 34.62 us.

It can be seen that in the embodiments of the present invention, compensation for gradient delay in the MR scanning sequence is performed on the basis of the gradient amplitude actually used, so that the MR scanning sequence is emitted at the correct time, ensuring the accuracy of the scanning result. Furthermore, the accurate compensation of gradient delay results in the scanned image being of improved quality, with the effect of artifacts on the scanned image being mitigated or eliminated.

Figure 5:
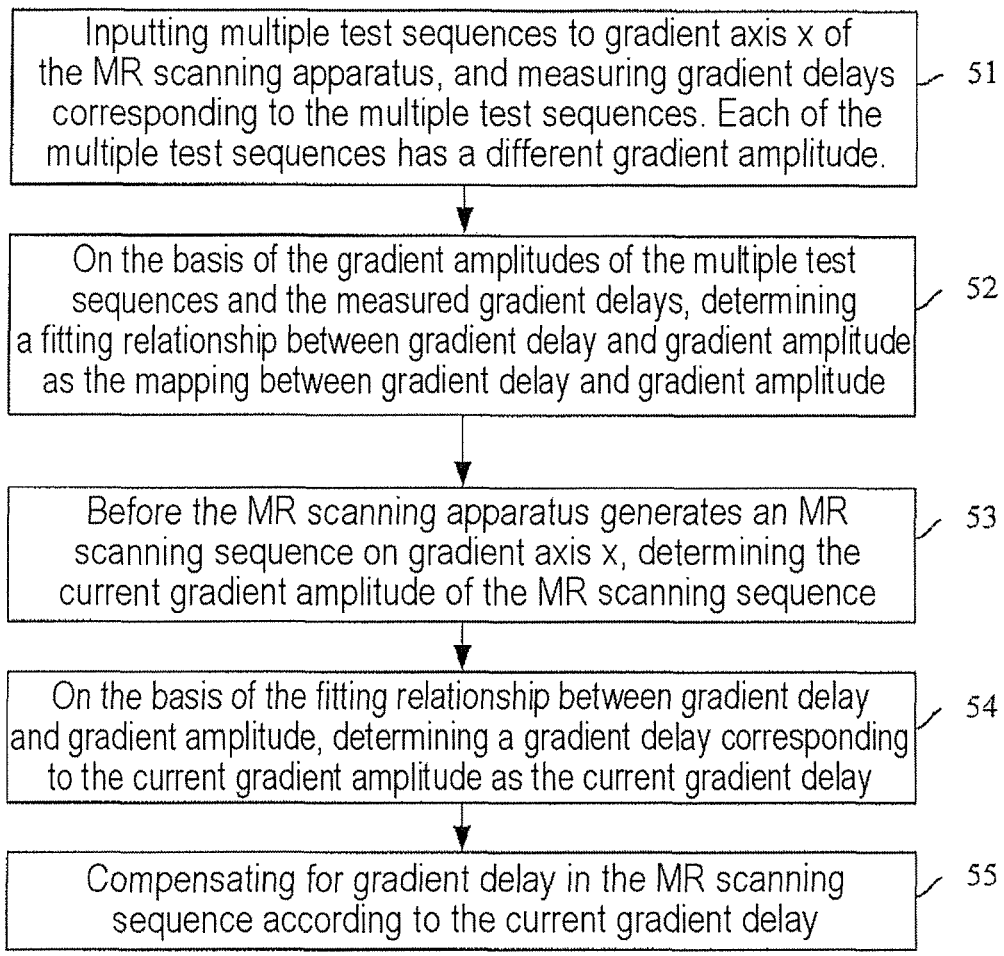
FIG. 5 is a flow chart of a method for performing compensation in an MR scanning sequence in another embodiment of the present invention.

FIG. 5 is a flow chart of a method for performing compensation in an MR scanning sequence in another embodiment of the present invention. As FIG. 5 shows, the method provided in the embodiments of the present invention for performing compensation in an MR scanning sequence comprises the following steps. In this embodiment, the example of one gradient axis (x) of the MR scanning apparatus is used for the purpose of illustration.

Step 51, inputting multiple test sequences to gradient axis x of the MR scanning apparatus, and measuring gradient delays corresponding to the multiple test sequences. Each of the multiple test sequences has a different gradient amplitude.

In this step, 30 test sequences are inputted to gradient axis x of the MR scanning apparatus, the gradient amplitude values of these 30 test sequences being 1, 2, . . . 30, respectively. Correspondingly, table 2 shows the measured gradient delays which correspond to the 30 test sequences.

TABLE 2

| | Gradient amplitude (mT/m) | | | | | | | | | |
|---|---|---|---|---|---|---|---|---|---|---|
| | 1 | 2 | 3 | 4 | 5 | 6 | 7 | 8 | 9 | 10 |
| Gradient delay (us) | 36.33 | 35.98 | 35.69 | 35.47 | 35.28 | 35.11 | 35.03 | 34.93 | 34.86 | 34.80 |
| | Gradient amplitude (mT/m) | | | | | | | | | |
| | 11 | 12 | 13 | 14 | 15 | 16 | 17 | 18 | 19 | 20 |
| Gradient delay (us) | 34.75 | 34.71 | 34.67 | 34.62 | 34.60 | 34.58 | 34.55 | 34.52 | 34.50 | 34.50 |
| | Gradient amplitude (mT/m) | | | | | | | | | |
| | 21 | 22 | 23 | 24 | 25 | 26 | 27 | 28 | 29 | 30 |
| Gradient delay (us) | 34.48 | 34.46 | 34.44 | 34.44 | 34.42 | 34.41 | 34.39 | 34.40 | 34.40 | 34.39 |

Step 52, on the basis of the gradient amplitudes of the multiple test sequences and the measured gradient delays, determining a fitting relationship between gradient delay and gradient amplitude as the mapping between gradient delay and gradient amplitude.

In the embodiments of the present invention, the values of gradient delay and gradient amplitude can be subjected to linear fitting, polynomial fitting or another type of fitting to obtain the fitting relationship between gradient delay and gradient amplitude.

In this step, the measured gradient delays and the test sequence gradient amplitudes obtained in step 51 are subjected to polynomial fitting, the fitting relationship obtained being: $y=36.7527-0.468274x+0.0449194x^2-0.00229727x^3+0.0000586647x^4-5.85919\times10^{-7}x^5$, wherein y is the gradient delay and x is the gradient amplitude.

Furthermore, steps 51 and 52 need only be performed once after installation of the MR scanning apparatus has been completed. The mapping between gradient delay and gradient amplitude determined can be used each time an MR scanning sequence is generated.

Step 53, before the MR scanning apparatus generates an MR scanning sequence on gradient axis x, determining the current gradient amplitude of the MR scanning sequence.

In this step, the current gradient amplitude of the MR scanning sequence is determined as 12.5 mT/m according to actual requirements.

Step 54, on the basis of the fitting relationship between gradient delay and gradient amplitude, determining a gradient delay corresponding to the current gradient amplitude as the current gradient delay.

In this embodiment, the gradient delay corresponding to any gradient amplitude can be obtained on the basis of the fitting relationship between gradient amplitude and gradient delay, so that subsequently determined current gradient delays are more accurate, and better MR scanned images are obtained.

In this step, based on the fitting relationship between gradient amplitude and gradient delay obtained in step 52, the gradient delay corresponding to the current gradient amplitude of 12.5 is 34.69 us.

Step 55, compensating for gradient delay in the MR scanning sequence according to the current gradient delay.

In this step, the MR scanning apparatus emits the MR scanning sequence after a delay of 34.69 us.

It can be seen that in the embodiments of the present invention, compensation for gradient delay in the MR scanning sequence is performed on the basis of the gradient amplitude actually used, so that the MR scanning sequence is emitted at the correct time, ensuring the accuracy of the scanning result. Furthermore, the accurate compensation of gradient delay results in the scanned image being of improved quality, with the effect of artifacts on the scanned image being mitigated or eliminated.

The embodiments of the present invention further provide an apparatus for compensating for gradient delay in an MR scanning sequence, capable of performing the above method for compensating for gradient delay in an MR scanning sequence.

Figure 6:
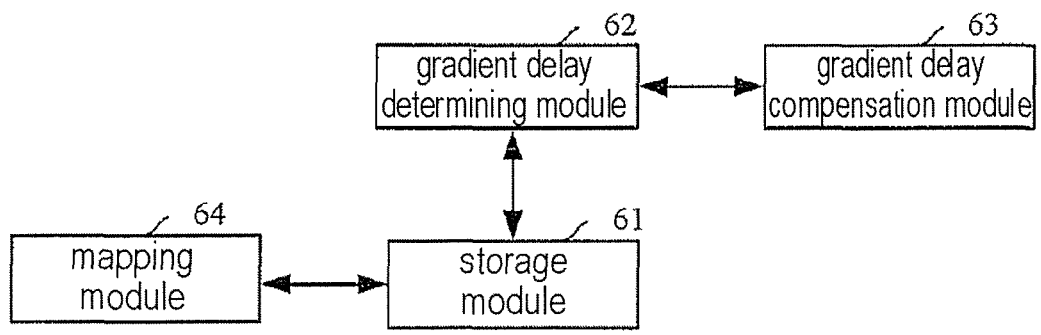
FIG. 6 is a schematic diagram of the structure of an apparatus for performing compensation in an MR scanning sequence in the embodiments of the present invention.

FIG. 6 is a schematic diagram of the structure of an apparatus for compensating for gradient delay in an MR scanning sequence in the embodiments of the present invention. As FIG. 6 shows, the apparatus provided in the embodiments of the present invention for compensating for gradient delay in an MR scanning sequence comprises a storage module 61, a gradient delay determining module 62 and a gradient delay compensation module 63.

The storage module 61 is used for storing mappings between gradient delay and gradient amplitude corresponding to each gradient axis of the MR scanning apparatus. The gradient delay determining module 62 is used for determining a current gradient amplitude of the MR scanning sequence, and on the basis of the current gradient amplitude and the mapping between gradient delay and gradient amplitude, determining a current gradient delay corresponding to the current gradient amplitude. The gradient delay compensation module 63 is used for compensating for gradient delay in the MR scanning sequence according to the current gradient delay.

Furthermore, in the embodiments of the present invention, the apparatus also comprises a mapping module 64, for acquiring the mapping between gradient delay and gradient amplitude.

In the embodiments of the present invention, the mapping module 64 comprises a test sub-module and an acquisition sub-module.

The test sub-module is used for inputting multiple test sequences to each gradient axis of the MR scanning apparatus, and measuring gradient delays corresponding to the multiple test sequences, each of the multiple test sequences having a different gradient amplitude. The acquisition sub-module is used for acquiring the mapping between gradient delay and gradient amplitude, the mapping comprising the gradient amplitudes of the multiple test sequences and the measured gradient delays.

Correspondingly, the gradient delay determining module 62 is specifically used for determining the gradient amplitude which is closest to the current gradient amplitude from amongst the gradient amplitudes included in the mapping between gradient delay and gradient amplitude, and determining the gradient delay in the mapping between gradient delay and gradient amplitude which is closest to the determined gradient amplitude as the current gradient delay.

In another embodiment of the present invention, the mapping module 64 comprises a test sub-module and a fitting sub-module. The test sub-module is used for inputting multiple test sequences to each gradient axis of the MR scanning apparatus, and measuring gradient delays corresponding to the multiple test sequences, each of the multiple test sequences having a different gradient amplitude. The fitting sub-module is used for determining a fitting relationship between gradient amplitude and gradient delay as the mapping between gradient delay and gradient amplitude, on the basis of the gradient amplitudes of the multiple test sequences and the measured gradient delays.

Correspondingly, the gradient delay determining module 62 is specifically used for determining a gradient delay corresponding to the current gradient amplitude on the basis of the fitting relationship between gradient delay and gradient amplitude, and setting the gradient delay so determined as the current gradient delay.

It can be seen that in the embodiments of the present invention, compensation for gradient delay in an MR scanning sequence is performed on the basis of the gradient amplitude actually used, so that the MR scanning sequence is emitted at the correct time, ensuring the accuracy of scanning results. Furthermore, the accurate compensation of gradient delay results in the scanned image being of improved quality, with the effect of artifacts on the scanned image being mitigated or eliminated.

Disclosed in the present invention is a method for compensating for gradient delay in an MR scanning sequence, comprising: determining a current gradient amplitude of the MR scanning sequence; on the basis of the current gradient amplitude and a mapping between gradient delay and gradient amplitude, determining a current gradient delay corresponding to the current gradient amplitude; compensating for gradient delay in the MR scanning sequence according to the current gradient delay. Applying the embodiments of the present invention can ensure the accuracy of scanning results, improve the quality of scanned images, and mitigate the effect of artifacts on scanned images.

The above are merely preferred embodiments of the present invention, and are not intended to define the scope of protection thereof. Appropriate improvements may be made to the preferred embodiments according to the present invention in the course of particular implementation to suit the specific requirements of particular situations. Thus it can be appreciated that the particular embodiments of the present invention set out herein merely serve the function of demonstration, and are by no means intended to limit the scope of protection of the present invention.

I claim as my invention:

1. A method for compensating for gradient delay in a magnetic resonance (MR) scanning sequence, comprising:

in a processor, determining, from said MR scanning sequence, a current gradient amplitude of the MR scanning sequence;

based on the current gradient amplitude and a mapping between gradient delay and gradient amplitude, determining, in said processor, a current gradient delay corresponding to the current gradient amplitude;

in said processor, compensating for gradient delay in the MR scanning sequence according to the current gradient delay so as to generate a compensated MR scanning sequence, which said gradient delay is compensated; and from said processor, making said compensated MR scanning sequence available as an output in a form configured to operate an MR scanning apparatus according to the compensated MR scanning sequence.

2. The method as claimed in claim 1, further comprising: acquiring the mapping between gradient delay and gradient amplitude by operating the MR scanning apparatus.

3. The method as claimed in claim 2, comprising acquiring the mapping between gradient delay and gradient amplitude by:
entering multiple test sequences into said processor for each gradient axis of an MR scanning apparatus, each of the multiple test sequences having a different gradient amplitude;
operating the MR scanning apparatus and measuring gradient delays corresponding to the multiple test sequences; and
acquiring the mapping between gradient delay and gradient amplitude as a relationship between the mapping comprising the gradient amplitudes of the multiple test sequences and the measured gradient delays.

4. The method as claimed in claim 3, comprising determining a current gradient delay corresponding to the current gradient amplitude on the basis of the current gradient amplitude and the mapping between gradient delay and gradient amplitude by:
determining the gradient amplitude which is closest to the current gradient amplitude from amongst the gradient amplitudes included in the mapping between gradient delay and gradient amplitude; and
determining the gradient delay in the mapping between gradient delay and gradient amplitude which is closest to the determined gradient amplitude as the current gradient delay.

5. The method as claimed in claim 2, comprising acquiring the mapping between gradient delay and gradient amplitude by:
operating the MR scanning apparatus with multiple test sequences for each gradient axis of an MR scanning apparatus, each of the multiple test sequences having a different gradient amplitude;
measuring gradient delays corresponding to the multiple test sequences; and
based on the gradient amplitudes of the multiple test sequences and the measured gradient delays, determining a fitting relationship between gradient delay and gradient amplitude as the mapping between gradient delay and gradient amplitude.

6. The method as claimed in claim 5, comprising determining a current gradient delay corresponding to the current gradient amplitude on the basis of the current gradient amplitude and the mapping between gradient delay and gradient amplitude by:
based on the fitting relationship between gradient delay and gradient amplitude, determining a gradient delay corresponding to the current gradient amplitude as the current gradient delay.

7. An apparatus for compensating for gradient delay in an MR scanning sequence, comprising:
a storage module configured to store mappings between gradient delay and gradient amplitude corresponding to each gradient axis of an MR scanning apparatus;
a gradient delay determining module configured to determine a current gradient amplitude of the MR scanning sequence, and based on the current gradient amplitude and the mapping between gradient delay and gradient amplitude, to determine a current gradient delay corresponding to the current gradient amplitude;
a gradient delay compensation module configured to compensate for gradient delay in the MR scanning sequence according to the current gradient delay; and
said gradient delay compensation module being configured to generate a compensated MR scanning sequence in which said current gradient delay is compensated, and to make said compensated MR scanning sequence available at an output of said gradient delay compensation module in electronic form for operating said MR scanning apparatus.

8. The apparatus as claimed in claim 7, further comprising:
a mapping module configured to acquire the mapping between gradient delay and gradient amplitude.

9. The apparatus as claimed in claim 8, wherein the mapping module comprises:
a test sub-module, configured to operate the MR scanning apparatus with multiple test sequences to each gradient axis of the MR scanning apparatus, each of the multiple test sequences having a different gradient amplitude; and measuring gradient delays corresponding to the multiple test sequences; and
an acquisition sub-module configured to acquire the mapping between gradient delay and gradient amplitude, the mapping comprising the gradient amplitudes of the multiple test sequences and the measured gradient delays.

10. The apparatus as claimed in claim 9, wherein the gradient delay determining module is configured to determine a gradient amplitude that is closest to the current gradient amplitude from among the gradient amplitudes included in the mapping between gradient delay and gradient amplitude, and to determine the gradient delay in the mapping between gradient delay and gradient amplitude that is closest to the determined gradient amplitude as the current gradient delay.

11. The apparatus as claimed in claim 8, wherein the mapping module comprises:
a test sub-module configured to operate the MR scanning apparatus with multiple test sequences to each gradient axis of the MR scanning apparatus, each of the multiple test sequences having a different gradient amplitude; and measuring gradient delays corresponding to the multiple test sequences; and
a fitting sub-module, configured to determine a fitting relationship between gradient amplitude and gradient delay as the mapping between gradient delay and gradient amplitude, based on the gradient amplitudes of the multiple test sequences and the measured gradient delays.

12. The apparatus as claimed in claim 11, wherein the gradient delay determining module is configured to determine a gradient delay corresponding to the current gradient amplitude as the current gradient delay on the basis of the fitting relationship between gradient delay and gradient amplitude.

* * * * *